United States Patent [19]

Ezaki et al.

[11] Patent Number: 5,088,908

[45] Date of Patent: Feb. 18, 1992

[54] CONTINUOUS VACUUM PROCESSING APPARATUS

[75] Inventors: Shinobu Ezaki, Ibaraki; Yukishige Kamino, Tsuchiura; Masaie Tohkai, Ryugasaki, all of Japan

[73] Assignee: Hitachi, Ltd., Tokyo, Japan

[21] Appl. No.: 495,120

[22] Filed: Mar. 19, 1990

[30] Foreign Application Priority Data

Mar. 20, 1989 [JP] Japan .................................. 1-66213

[51] Int. Cl.⁵ ...................... B29C 71/00; C23C 14/24; C23C 14/56
[52] U.S. Cl. ......................................... 425/73; 118/33; 118/718; 118/719; 264/40.7; 264/83; 264/101; 264/288.4; 264/DIG. 78; 425/135; 425/445; 425/DIG. 60; 427/8; 427/124; 427/251
[58] Field of Search ................... 264/40.7, 101, 82, 83, 264/DIG. 78, 288.4, 288.8; 118/718, 719, 733, 723, 33; 204/298.24, 298.25; 427/8, 124, 251; 425/445, 446, 135, 73, DIG. 60

[56] References Cited

U.S. PATENT DOCUMENTS

| 3,057,792 | 10/1962 | Frohllch . | |
|---|---|---|---|
| 3,954,866 | 7/1971 | Skinner et al. | 425/446 |
| 3,990,390 | 11/1976 | Plyshevsky et al. | 118/719 |
| 4,551,310 | 11/1985 | Imada et al. | 118/718 |
| 4,743,419 | 5/1988 | Bierschenk | 264/101 |
| 4,744,930 | 5/1988 | Twist et al. | 264/40.7 |
| 4,763,601 | 8/1988 | Saida et al. | 118/719 |
| 4,847,109 | 7/1989 | Shibasaki et al. | 427/251 |

FOREIGN PATENT DOCUMENTS

| 130444 | 1/1985 | European Pat. Off. . | |
|---|---|---|---|
| 157573 | 10/1985 | European Pat. Off. . | |
| 293607 | 12/1988 | European Pat. Off. . | |
| 57-195739 | 12/1982 | Japan . | |
| 62-4866 | 1/1987 | Japan | 118/718 |
| 62-30879 | 2/1987 | Japan | 118/718 |
| 62-37367 | 2/1987 | Japan | 118/718 |
| 63-305140 | 12/1988 | Japan . | |
| 63-305141 | 12/1988 | Japan . | |
| 2900724 | 5/1986 | United Kingdom . | |

*Primary Examiner*—Jeffrey Thurlow
*Assistant Examiner*—Mathieu Vargot
*Attorney, Agent, or Firm*—Antonelli, Terry, Stout & Kraus

[57] ABSTRACT

A continuous vacuum processing apparatus has a vacuum processing chamber and at least one auxiliary vacuum chamber connected to at least one of the upstream and downstream ends of the vacuum processing chamber as viewed in the direction of flow of a material to be processed. The apparatus further has a slit-type seal device provided in the auxiliary vacuum chamber and capable of conveying the material to be processed while sealing the vacuum processing chamber from exterior of the vacuum processing chamber. The seal device is provided with a guide member for guiding the material. Independent tensioning devices are provided in the vacuum processing chamber and the auxiliary vacuum chamber and capable of independently applying tensions to the portions of the material in the vacuum processing chamber and auxiliary vacuum chamber, so that a material which is not resistant to heat can be processed without being damaged.

5 Claims, 9 Drawing Sheets

CONTINUOUS VACUUM PROCESSING APPARATUS

BACKGROUND OF THE INVENTION

1. Field of the Invention

The present invention relates to a method of and an apparatus for effecting, in a vacuum atmosphere, a continuous processing such as plasma processing, evaporation or the like, on an article such as a formed plastic article including, for example, a polyethylene terephthalate film, natural or synthetic fibers, coated steel sheet, and so forth.

2. Description of the Prior Art

In general, a continuous vacuum processing apparatus of the kind mentioned above.employs, as disclosed in Japanese Patent Unexamined Publication No. 57-195739, a roll-type sealing device which has a pair of rolls capable of nipping therebetween web material to be processed. A slit-type sealing device shown in Japanese Patent Unexamined Publication No. 63-305140 also is known.

These known arts, however, do not pay specific attention to thermal influence on a very thin web material during conveyance or vacuum processing such as plasma processing, so that damages are often caused in the processed product.

SUMMARY OF THE INVENTION

Accordingly, an object of the present invention is to provide a continuous vacuum processing apparatus which can continuously process a web material in a vacuum atmosphere without causing any damage of the web material.

To this end, according to the present invention, there is provided a continuous vacuum processing apparatus for continuously processing a web material in a vacuum atmosphere, having a vacuum processing chamber and at least one auxillary, e.g. preliminary vacuum chamber connected to at least one of the upstream and downstream sides of the vacuum processing chamber, comprising independent tensioning devices for independently tensioning portions of the web material in the preliminary vacuum chambers and in the vacuum processing chamber.

The effect produced by the independent application of tension is enhanced when tension interrupting devices are provided in addition to the independent tensioning devices.

In operation, the web material fed from the upstream side of the preliminary vacuum chamber is relieved from tension by the tension interrupting device which is disposed upstream of this preliminary vacuum chamber. The portion of the web material within the preliminary vacuum chamber upstream of the vacuum processing chamber if suitably tensed by a tensioning device in this preliminary vacuum chamber. At the same time, a tension interrupting device provided in the vacuum processing chamber operates to free the portion of the web material in this chamber from tensions applied through the preliminary vacuum chambers on the upstream and downstream sides of the vacuum processing chamber, while a tensioning device provided in the vacuum processing chamber suitably tenses the portion of the web material in this chamber. The tension applied to the portion of the web material in the preliminary vacuum chamber downstream of the vacuum processing chamber is suitably determined by a tensioning device provided in this preliminary vacuum chamber. The independent control of tension levels in the vacuum processing chamber and both preliminary vacuum chambers enables a continuous processing of the web material while diminishing occurrence of damage on the web material to be processed.

DESCRIPTION OF THE PREFERRED EMBODIMENTS

Figure 1:
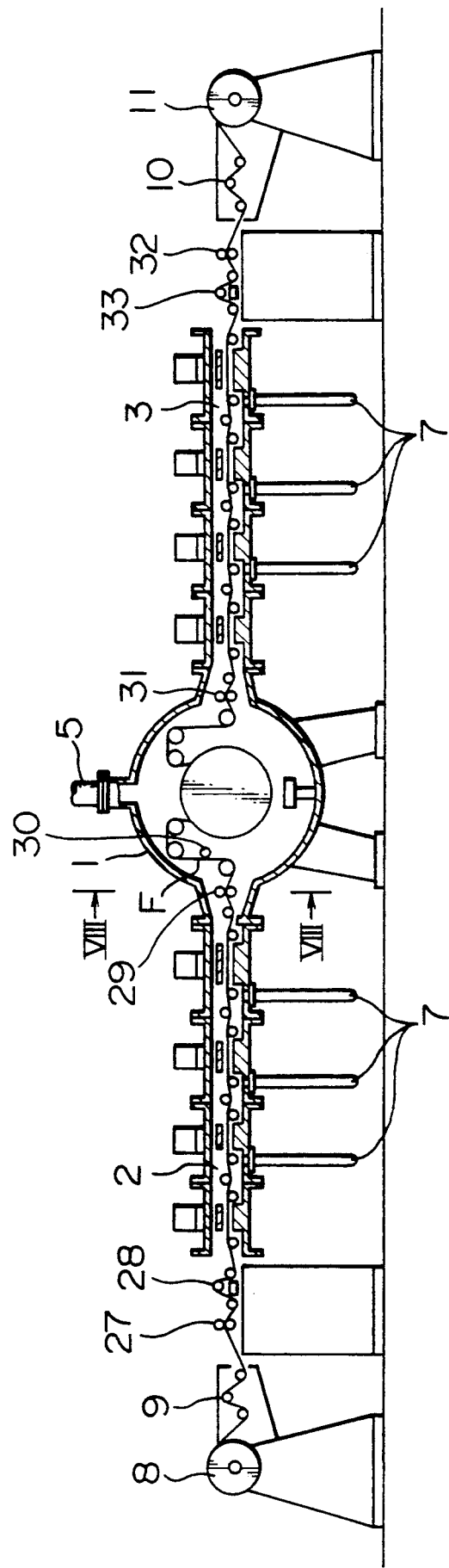
FIG. 1 is a schematic longitudinal sectional view of an embodiment of the continuous vacuum processing apparatus in accordance with the present invention.
Figure 2:
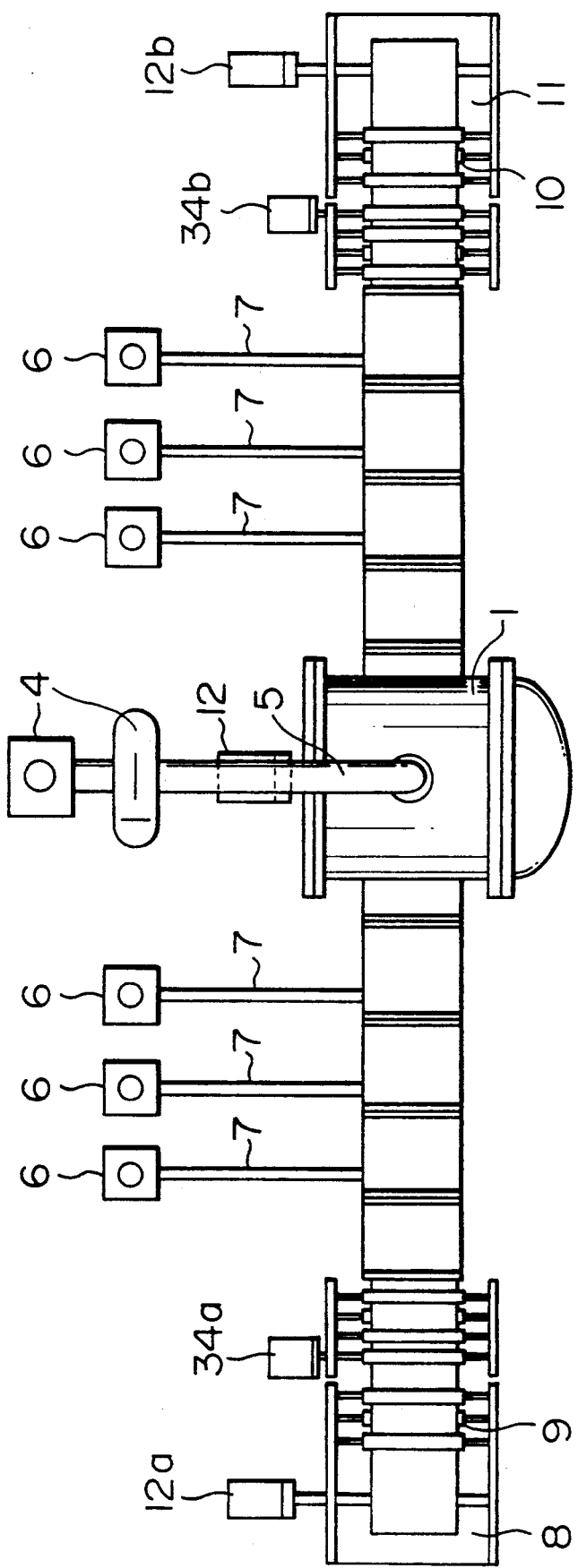
FIG. 2 is a schematic plan view of the embodiment shown in FIG. 1.

Referring to FIGS. 1 and 2, a continuous vacuum processing apparatus embodying the present invention has a vacuum processing chamber 1 in which a flexible continuous web material F to be processed such as a plastic film, e.g., a polyethylene terephthalate film, is continuously processed by plasma under a vacuum condition. Preliminary vacuum chambers 2 and 3 are provided respectively on the upstream and downstream sides of the vacuum processing chamber 1. A vacuum pump 4 is connected to the vacuum processing chamber 1 through an evacuating conduit 5 so as to evacuate the vacuum processing chamber 1 thereby maintaining a vacuum of $10^{-3}$ Torr or so in the latter.

Each of the preliminary vacuum chambers 2 and 3 is evacuated by vacuum pumps 6 connected thereto through corresponding evacuation conduits 7 so as to provide vacuums whose pressures are slightly higher than the vacuum pressure in the vacuum processing chamber 1 and which decrease in stepwise fashion from atmospheric pressure.

The web material F to be processed is supplied from a supply reel 8 and is introduced into the preliminary vacuum chambers through a tension control guide roller 9 which controls the tension applied to the web material supplied. A tension interrupting device 27 disposed upstream of the preliminary vacuum chamber serves to free the web material F from the tension applied by the tension control guide roller 9. The tension applied to the portion of the web material F in the upstream preliminary vacuum chamber 2 is detected by a tension detector 28. The product F which has passed through the upstream preliminary vacuum chamber 2 is introduced into the vacuum processing chamber 1 through a tension interrupting device 29 provided in the vacuum processing chamber 1 so as to be processed by plasma in this chamber 1. The vacuum processing chamber 1 has another tension interrupting device 31 and a tensioning guide roller 30 between two tension interrupting devices 29 and 31, so that a suitable level of tension is applied to the portion of the web material in the vacuum processing chamber 1 by the tensioning guide roller 30. The web material F is then introduced into the downstream preliminary vacuum chamber 3. The portion of the web material F in the downstream preliminary vacuum chamber 3 is freed from the tension applied in the vacuum processing chamber 1 by the tension interrupting device 31 and also from a take-up tension by a tension interrupting device 32. A suitable level of tension is applied to this portion of the web material by a later-mentioned tensioning guide roller, regardless of the tension in the vacuum processing chamber 1 and the take-up tension. The level of the tension applied to this portion of the web material is detected by a tension detector 33. Thereafter, the web material F is taken by a take-up reel 11 through a guide roller 10 which controls the take-up tension. Numerals 12a and 12b denote DC motors for feeding the web material F to be processed, while numerals 34a and 34b denote DC motors for driving guide rollers for interrupting tension.

Figure 3:
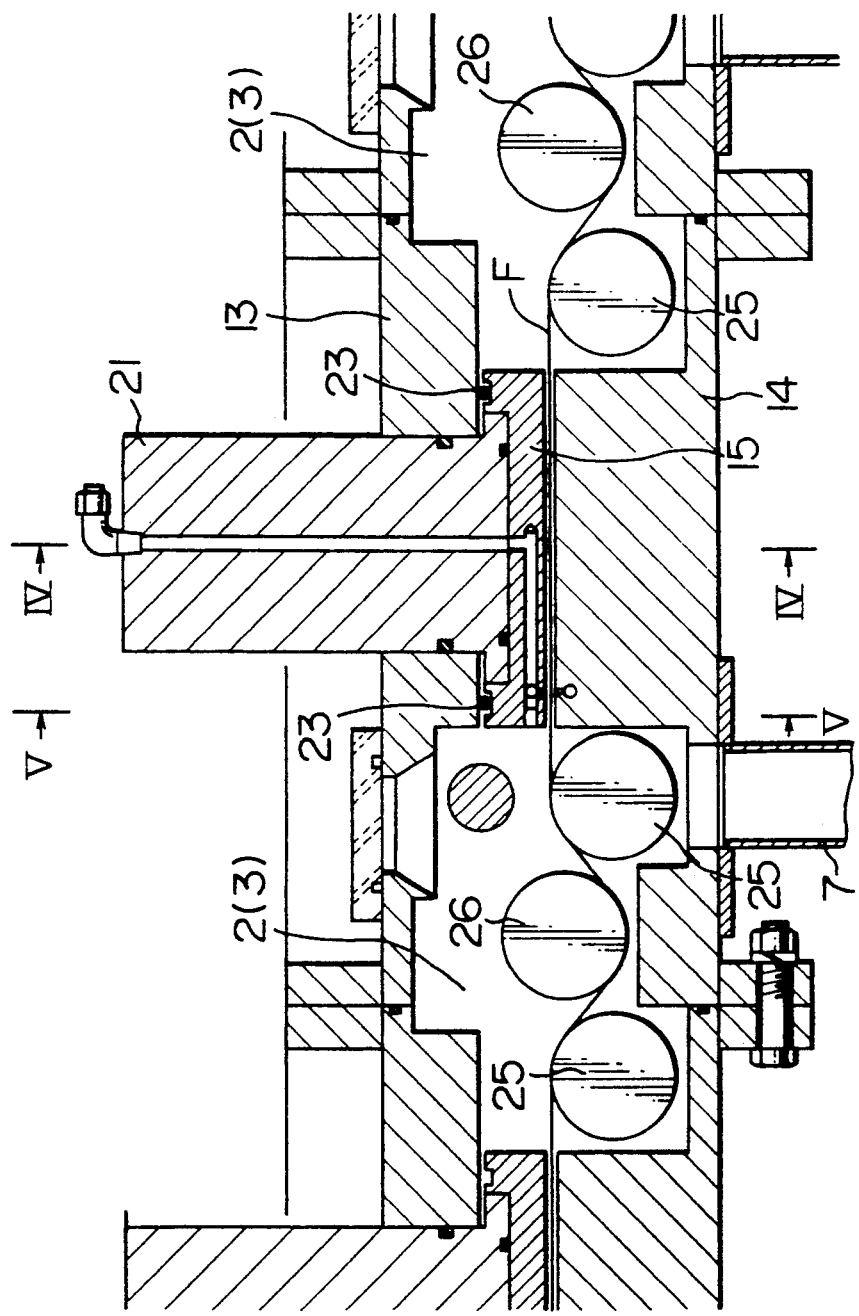
FIG. 3 is a longitudinal sectional view of a seal device.
Figure 4:
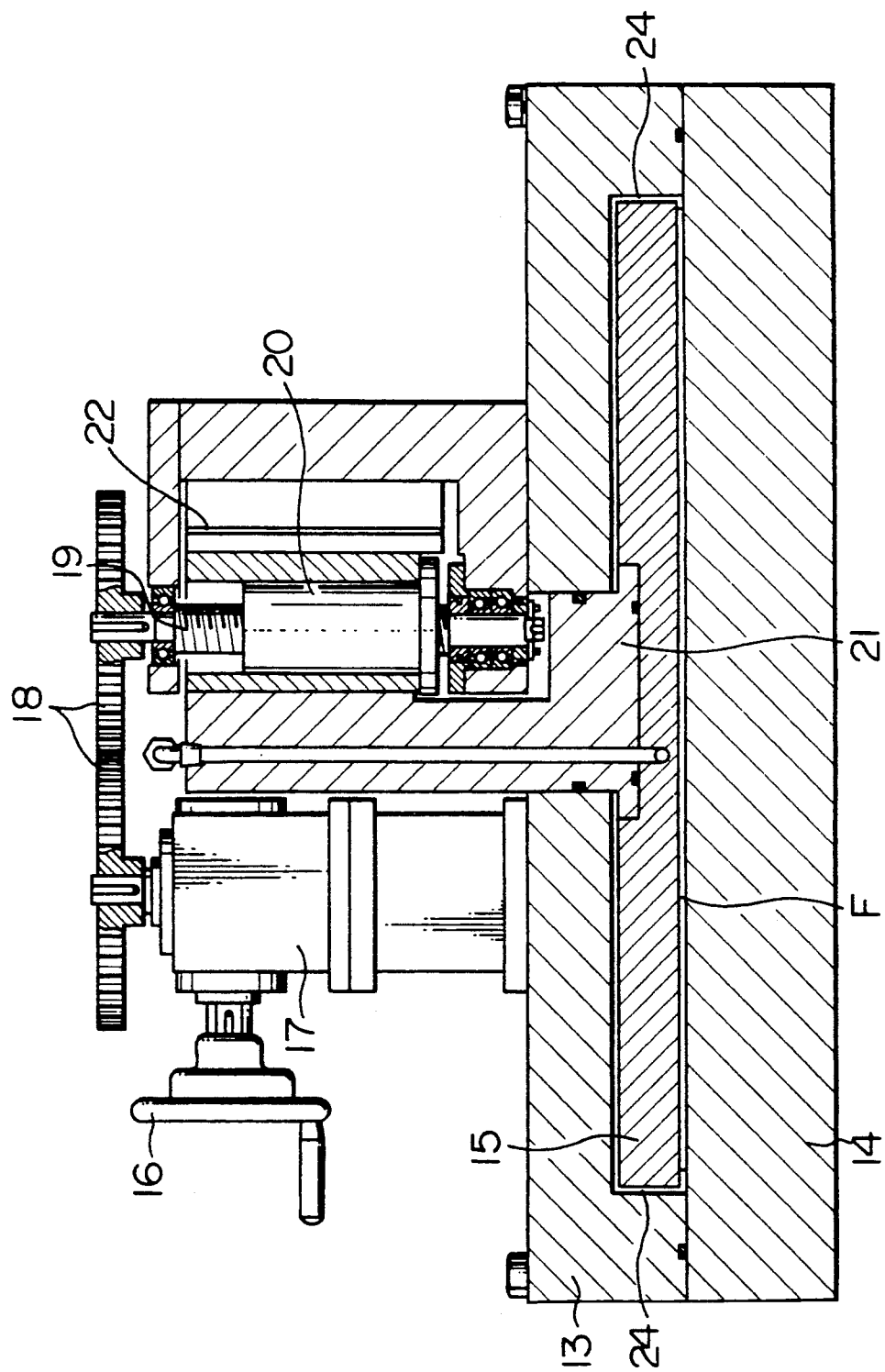
FIG. 4 is a sectional view taken along the line IV—IV of FIG. 3.
Figure 5:
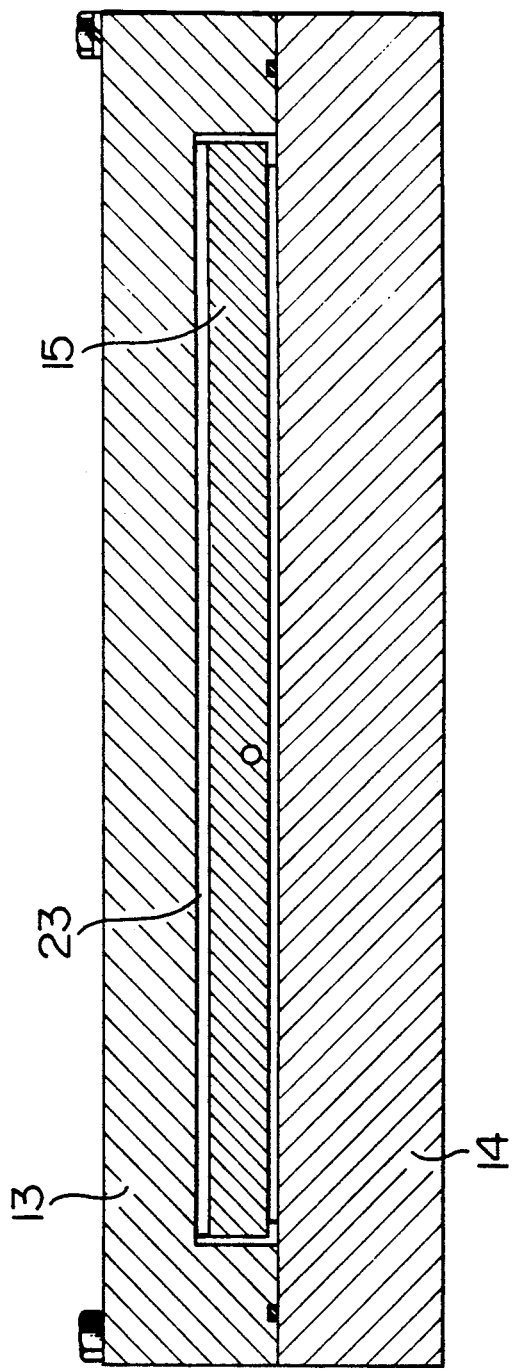
FIG. 5 is a sectional view taken along the line V—V of FIG. 3.

FIGS. 3, 4 and 5 show an essential portion of the seal device which forms each of the preliminary vacuum chambers 2 and 3. More specifically, FIG. 4 is a sectional view taken along the line IV—IV of FIG. 3, while FIG. 5 is a sectional view taken along the line V—V. A numeral 13 denotes an upper case, 14 denotes a lower case and 15 denotes a seal block guided and supported by the upper case 13. The web material F to be processed is fed through a slit defined between the lower case 14 and the seal block 15 without contacting the lower case 14 and the seal block 15. Numeral 16 denotes a handle which is capable of driving a column 21 integral with the seal block 15, through a reducing gear 17, a gear 18, a ball screw 19 and a nut 20, so that the seal block 15 is moved up and down in accordance with the thickness of the web material F to be processed. Numeral 22 denotes a guide for guiding the seal block 15 when the latter is moved up and down. Numeral 23 denotes an "O" ring which provides a seal between the upper case 13 and the seal block 15. In order to keep an effective seal between the upper case 13 and the seal block 15 regardless of the vertical displacement of the seal block 15 which is 2 mm at the maximum, the O ring 23 is made of a material having a sufficiently large elasticity. The clearance 24 between the upper case 13 and the seal block 15 is made as small as possible, e.g., 30 microns, in order to minimize the leak of air through this clearance while ensuring smooth vertical movement of the seal block 15. Numeral 25 designates a guide roll for guiding the web material F to be processed. In order to prevent the web material F to be processed from contacting the seal surface of the lower case 14, the outer peripheral surface of the guide roll 25 is determined to be higher than the lower case 14. In the normal use of the apparatus, the positions of the guide roll 25 and the seal block 15 are so determined that a gap of 0.1 mm is left between the web material F to be processed and the seal block 15 and between the web material F to be processed and the lower case 14. Numeral 26 denotes a tensioning roll which serves to wind the web material F to be processed on the guide roll 25 over a greater winding angle, thus imparting tension to the web material F to be processed. The tensioning roll 26 suppresses vibration of the web material F in the seal portion so as to avoid accidental collision of the web material F with the walls of the seal which may otherwise be caused due to vibration. The successive preliminary vacuum chambers 2 or 3 are defined by the seal devices arranged in stages, and are evacuated by vacuum pumps 6 through evacuating conduits 7.

Figure 6:
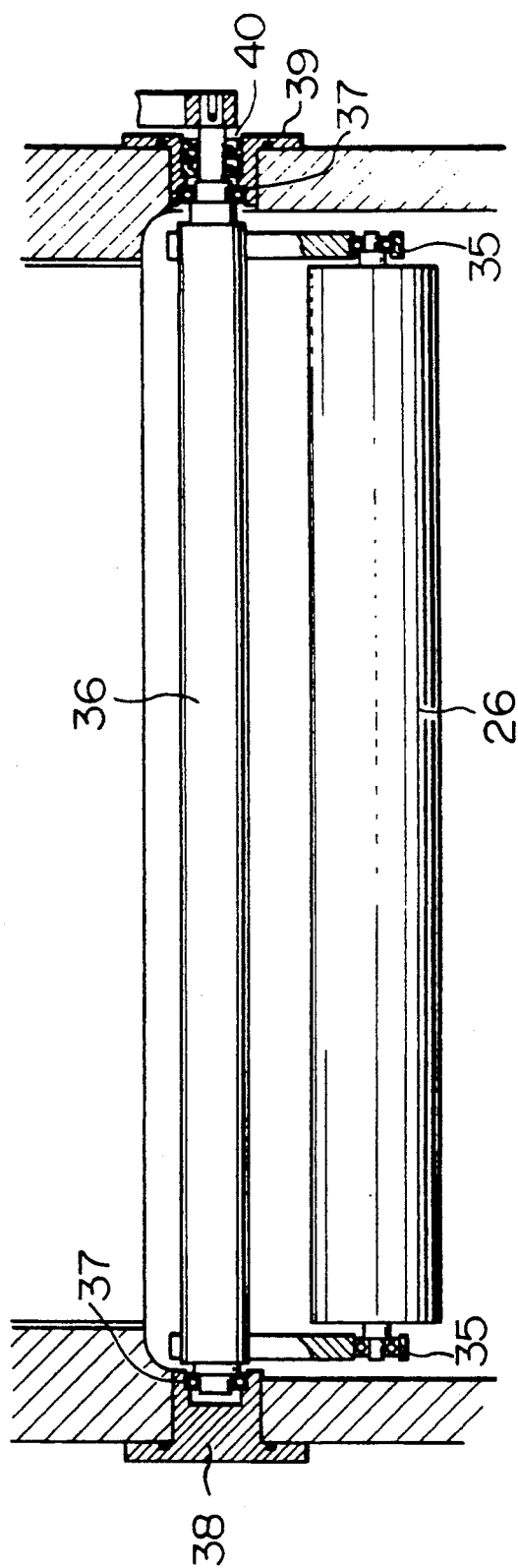
FIGS. 6 and 7 are a cross-sectional view and a side elevational view of a portion including a tensioning guide roller.
Figure 7:
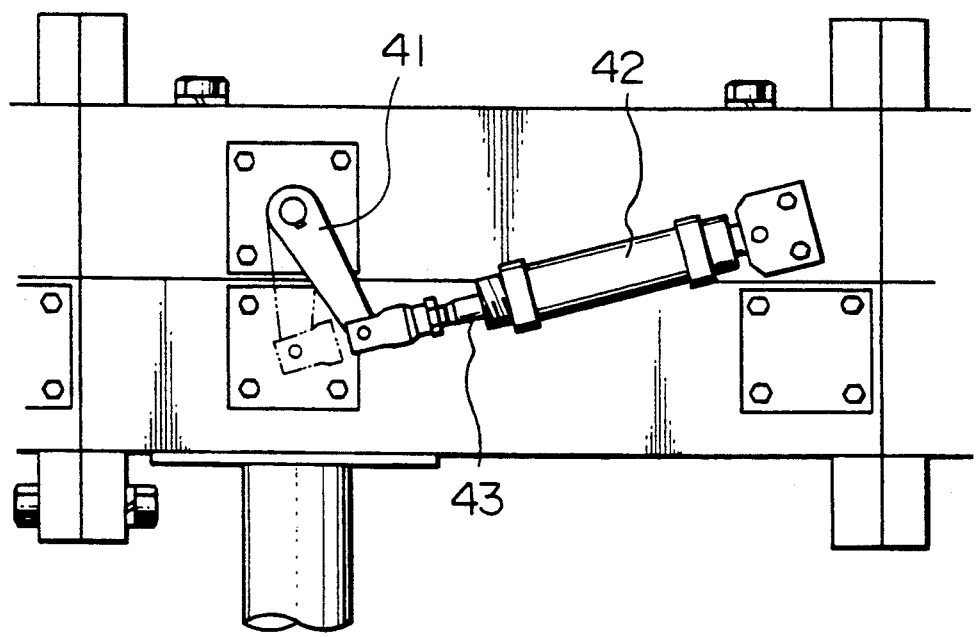

FIGS. 6 and 7 show an example of the structure for supporting the tensioning guide roller 26. The guide roller 26 is supported by an arm 36 through a bearing 35. The arm 36 in turn is supported by bearing housing members 38, 39 through a bearing 37. A vacuum-tight seal is formed between the bearing housing member 39 and the supported portion of the arm 36 by means of an oil seal 40. A plate 41 is secured to an end of the arm 36 adjacent to the atmosphere. The end of the plate 41 opposite to the arm 36 is connected to one end of a piston 43 received in a pneumatic cylinder 42. In consequence, the tensioning guide roller 26 operates in accordance with the pneumatic cylinder 42 and the piston 43. It is therefore possible to control the tension applied to the web material F to be processed by varying the pneumatic pressure applied to the pneumatic cylinder 42. By attaching a position sensor to the piston 43, it is possible to detect the position of the tensioning guide roller 26 and, hence, to control the position of the tensioning guide roller 26 more precisely. The tensioning device 30 provided in the vacuum processing chamber 1 can have a similar construction.

Figure 8:
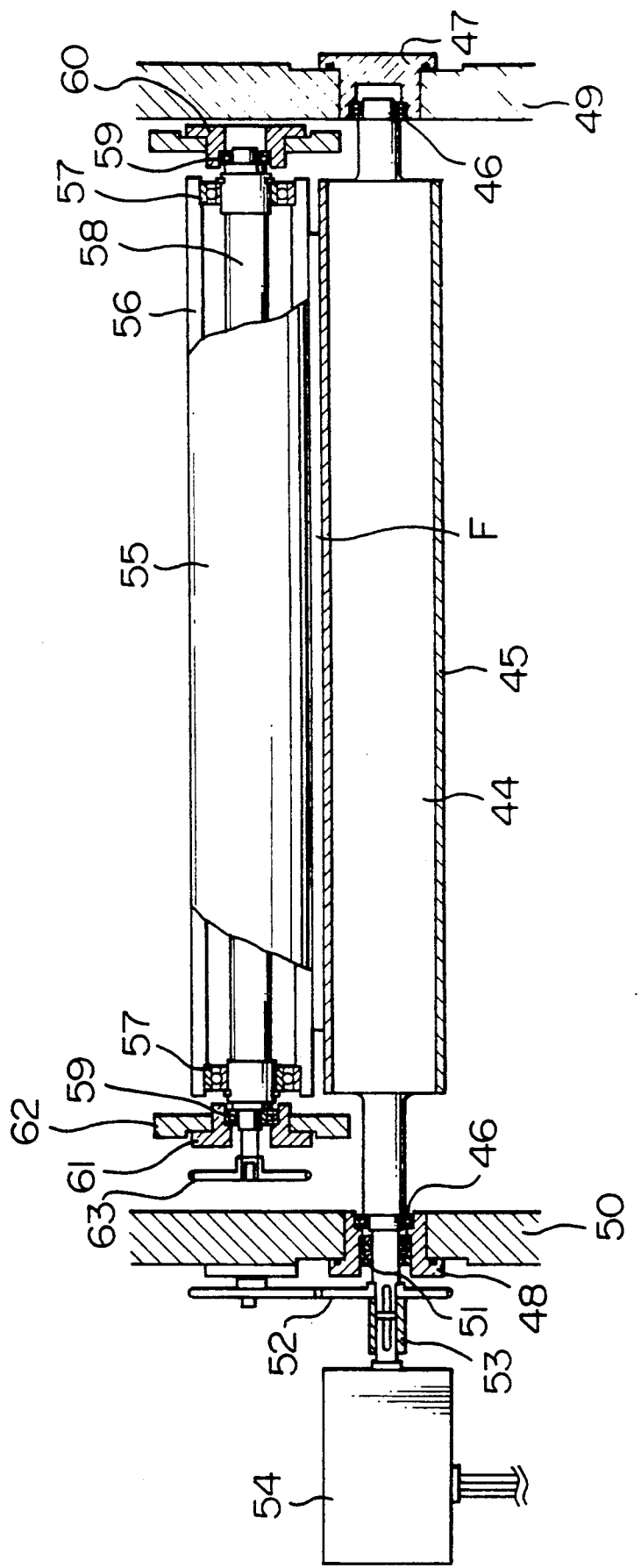
FIG. 8 is a sectional view taken along the line VIII—VIII of FIG. 1.
Figure 9:
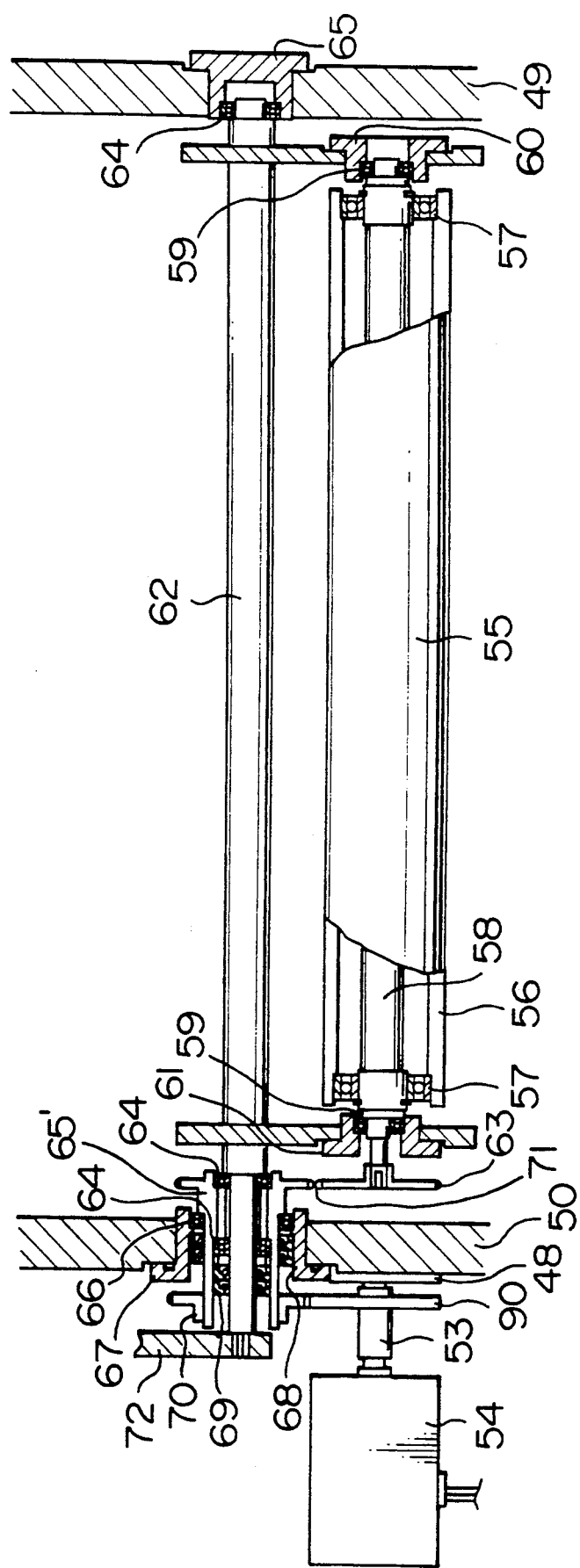
FIG. 9 is a top plan view of FIG. 8.

FIGS. 8 and 9 show an example of a tensioning device provided in the vacuum processing chamber 1. The tensioning device is composed mainly of a pair of guide rollers. Numeral 44 designates a guide roller which is coated with polymeric material which exhibits a small rate of emission of gas in vacuum. No slip takes place between the coating surface of the guide roller 44 and the web material F to be processed. The guide roller 44 is supported at its both ends by bearing housings 47 and 48 through bearings 46. The bearing housing 47 is fixed to a stay 49, while the other bearing housing 48 is fixed to a side plate 50 of the vacuum processing chamber 1. An oil seal 51 provides a vacuum-tight seal between the guide roller 44 and the bearing housing 48. The guide roller 44 is provided at its end adjacent to the atmosphere with a gear 52 and is coupled to a driving DC motor 54 through a coupling 53. The DC motor 54 is controlled in accordance with the result of detection of the position of the tensioning guide roller 30 (see FIG. 1) such that the web material F is fed at a set speed under a suitable level of tension. The other guide roller 55 of the pair of guide rollers 44, 55 has a rotatable drum portion 56, bearings 57 and a shaft 58. The guide roller 55 is supported on bearing housings 60 and 61 through bearings 59 on both ends of the shaft 58. The bearing housings 60 and 61 are fixed to the arm 62. A gear 63 is fixed to one end of the shaft 58. The arm 62 is supported at one end by a bearing housing 65, through a bearing 64 and at the other end by a gear 65'. The bearing housing 65' is fixed to the stay 49. The gear 65 is supported by a bearing housing 67 through a bearing 66. The bearing housing 67 is fixed to the side plate 50 of the vacuum processing chamber 1. Oil seals 68 and 69 provide vacuum-tight seals between the gear 65 and the arm 62 and between the gear 65' and the bearing housing 67. A gear 70 is fixed to the end of the gear 65' adjacent to the atmosphere. A gear 90 is rotated by the DC motor 54 so that the gears 70 and 65' rotate in a direction counter to the direction of rotation of the gear 90. The gear 65' and the gear 63 are connected to each other through a timing belt 71 and the guide roller 55 rotates in a direction counter to the direction of rotation of the guide roller 44 at the same speed as the guide roller 44. A plate 72 fixed to one end of the arm 62 is adapted to be actuated by, for example, a pneumatic cylinder so as to vary the position of the guide roller 55. When the web material F to be processed is threaded, the guide rollers 44 and 55 are spaced apart from each other, whereas, when a tension is to be interrupted, the web material F to be processed is pinched between the guide rollers 44 and 55. The pressure at which the guide roller 55 is pressed against the web material F to be processed is controlled through adjustment of the pneumatic pressure supplied to the pneumatic cylinder so as not to cause any damage on the web material F to be processed.

In the vacuum processing chamber, a process such as plasma processing, evaporation or the like is effected to the web material F so that the web material F is subjected to a temperature which is higher than those developed in the preliminary vacuum chambers. Therefore, when the web material is a vinyl chloride film which is not resistant to heat or a film which is resistant to heat but extremely thin, the web material tends to be elongated in the vacuum processing chamber. If the tension applied to the web material in the vacuum processing chamber is of the same level as the tension developed in the preliminary vacuum chambers, the web material exhibits a greater tendency of wrinking in the vacuum processing chamber than in the preliminary vacuum chambers. Conversely, if the tension in the vacuum processing chamber is reduced to decrease the amount of wrinkling in this chamber and if the tension in the vacuum chambers also is reduced equally, vertical vibration of the web material, which inevitably takes place due to, for example, a difference in the level of vacuum across the web material, is enhanced to cause the web material to be damaged due to collision with the lower case or the seal block. It is therefore desirable that a comparatively greater tension is applied to the portions of the web material passing through the preliminary vacuum chambers so as to reduce vertical vibration and, hence, damaging of the web material, whereas, in the vacuum processing chamber, the tension is preferably maintained low in order to prevent wrinkling of the web material. According to the invention, since independent tensioning devices are used for applying tensions to the portions of the web material in the vacuum processing chamber and the preliminary vacuum chambers, it is possible to apply a comparatively large tension to the portions of the web material in the preliminary vacuum chambers, while maintaining a comparatively low level of tension in the portion of the web material in the vacuum processing chamber. It is therefore possible to effect a vacuum processing such as plasma processing, evaporation or the like, while suppressing occurrence of troubles such as damaging and wrinkling of the web material. If the degree or extent of damaging and amount of wrinkling observed in known vacuum processing apparatus is endurable, it is possible to enhance the processing speed and, hence, to improve rate of operation of the vacuum processing apparatus.

What is claimed is:

1. A continuous vacuum processing apparatus of the type having a vacuum processing chamber and at least an upstream auxiliary vacuum chamber connected to the upstream end of said vacuum processing chamber as view in the direction of flow of a material to be processed, said apparatus comprising: a slit-type seal device provided in said upstream auxiliary vacuum chamber and capable of conveying the material to be processed while sealing said vacuum processing chamber from the exterior of said vacuum processing chamber, said seal device being provided with a guide member for guiding said material; independent tensioning means provided in said vacuum processing chamber and said upstream auxiliary vacuum chamber for independently applying tensions to the portions of said material in said vacuum processing chamber and said upstream auxiliary vacuum chamber, said independent tensioning means including first tensioning means provided in said vacuum processing chamber for applying tension to the portion of said material in said vacuum processing chamber, second tensioning means provided in said upstream auxiliary vacuum chamber for applying tension to the portion of said material in said auxiliary upstream vacuum chamber, and tension interrupting means including a pair of opposed rotatable rollers disposed along the direction of flow of the material between said first and second tensioning means and means to vary the position of one of said opposed rollers relative to the other roller whereby said material is freed from tension applied thereto by pinching said material between said rollers.

2. A continuous vacuum processing apparatus according to claim 1, wherein said tension interrupting means is disposed in said vacuum processing chamber near a joint portion between said upstream auxiliary vacuum chamber and said vacuum processing chamber.

3. A continuous vacuum processing apparatus according to claim 1, wherein said upstream auxiliary vacuum chamber is provided with additional tension interrupting means provided at an upstream or downstream end thereof so as to free the portion of said material in said upstream auxiliary vacuum chamber from externally applied tension.

4. A continuous vacuum processing apparatus according to claim 1, wherein said tensioning means includes movable rollers.

5. A continuous vacuum processing apparatus according to claim 4, further comprising position detecting means for detecting the position of said tensioning means, and said tension interrupting means being operated in accordance with an output from said position detecting means.

* * * * *